United States Patent [19]
Brigham et al.

[11] Patent Number: 6,046,494
[45] Date of Patent: Apr. 4, 2000

[54] HIGH TENSILE NITRIDE LAYER

[75] Inventors: Lawrence N. Brigham, Beaverton, Oreg.; Yung-Huei Lee, Sunnyvale, Calif.; Robert S. Chau; Raymond E. Cotner, both of Beaverton, Oreg.

[73] Assignee: Intel Corporation, Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/791,867

[22] Filed: Jan. 31, 1997

Related U.S. Application Data

[62] Division of application No. 08/660,734, Jun. 6, 1996, Pat. No. 5,633,202, which is a continuation of application No. 08/269,436, Jun. 30, 1994, abandoned.

[51] Int. Cl.[7] .......................... H01L 23/58; H01L 29/76; H01L 29/94; H01L 31/062
[52] U.S. Cl. .......................... 257/640; 257/412; 257/413
[58] Field of Search ................................. 257/640, 412, 257/413

[56] References Cited

U.S. PATENT DOCUMENTS

| | | | |
|---|---|---|---|
| 4,208,780 | 6/1980 | Richman . | |
| 4,441,247 | 4/1984 | Gargini et al. | 29/571 |
| 4,557,036 | 12/1985 | Kyuragi et al. | 29/571 |
| 4,650,696 | 3/1987 | Raby | 427/89 |
| 4,732,801 | 3/1988 | Joshi . | |
| 4,749,631 | 6/1988 | Haluska et al. | 428/704 |
| 4,755,480 | 7/1988 | Yau et al. . | |
| 4,866,003 | 9/1989 | Yokoi et al. | 437/40 |
| 4,920,073 | 4/1990 | Wei et al. . | |
| 4,948,482 | 8/1990 | Kobayashi et al. . | |
| 4,966,870 | 10/1990 | Barber et al. . | |
| 4,997,518 | 3/1991 | Madokoro | 156/643 |
| 5,089,432 | 2/1992 | Yoo . | |
| 5,180,688 | 1/1993 | Bryant et al. . | |
| 5,275,972 | 1/1994 | Ogawa et al. | 437/195 |
| 5,285,103 | 2/1994 | Chen et al. | 257/644 |
| 5,314,847 | 5/1994 | Watanabe et al. | 437/239 |
| 5,372,969 | 12/1994 | Moslehi | 437/195 |
| 5,409,858 | 4/1995 | Thakur et al. | 437/173 |
| 5,474,955 | 12/1995 | Thakur . | |

OTHER PUBLICATIONS

R.C. Sun, J.T. Clemens, J.T. Nelson, "Effects of Silicon Nitride Encapsulation on MOS Device Stability". JEEE 18th Annual Proceedings Reliability Physics 1980, pp. 244–251.

A. Hamada, E. Takeda, "AC Hot–Carrier Effect Under Mechanical Stress", IEEE Symposium on VLSI Technology Digest of Technical Papers, Jun. 1992, pp. 98–99.

M. Shimbo, T. Matsuo, "Thermal Stress in CVD PSG and $SiO_2$ Films on Silicon Substrates", Journal of the electrochemical Society, vol. 130 No. 1 Jan. 1983, pp. 135–138.

K. Okuyama, K. Kubota, T. Hashimoto, S. Ikeda, A. Koike, "Water–Relater Threshold Voltage Instability of Polysilicon TFTs", IEDM International Electron Devices Meeting, Dec. 1993, pp. 527–530.

N. Lifshitz, G. Smolinsky, "Water–Related Charge Motion in Dielectrics", Journal of the Electrochemical Society, vol. 136, No. 8, Aug. 1989, pp. 2335–2340.

M. Noyori, et al, "Comparisons of Instabilities in Scaled CMOS Devices Between Plastic and Hermetically Encapsulated Devices", IEEE Transactions on Reliability, Aug. 1983, pp. 323–329.

Wolf, *Silicon Processing for the VLSI Era, vol. 1: Process Tech.* pp. 191–195, 1986.

W. H. Stinebaugh, Jr., A. Harrus, W.R. Knolle, "Correlation of Gm Degradation of Submicrometer MOSFET's with Refractive Index and Mechanical Stress of Encapsulation Materials", IEEE Transactions on Electron Devices, Vo. 36, No. 3, Mar. 1989, pp. 542–547.

C.E. Blat, E.H. Nicollian, E.H. Poindexter, "Mechanism of Negative–Blas–Temperature Instability", Journal of Applied Physics, vol. 69, No.3, Feb. 1991, pp. 1712–1720.

J. Takahashi, K. Machida, N. Shimoyama, K. Minegishi, "Water Trapping effect of Point Defects in Interlayer Plasma CVD $SiO2$ Films", Proceedings Ninth International VLSI Multilevel Interconnection Converence (VMIC), Jun. 1992, pp. 331–336.

N. Stojadinovic, S. Dimitrijev, "Instabilities in MOS Transistors", Microelectroncs and Relibility, 1989, vol. 29, No.3 pp. 371–380.

K. Shmokawa, T. Usami, S. Tokitou, N. Hirashita, M. Yoshimaru, M. Ino, "Supression of the MoS Transistor Hot Carrier Degradation Casued by Watdr Desorbed from Intermetal Dielectric", IEEE Symposium on VLSI Technology Digest of Technical Papers, Jun. 1992, pp. 96–97.

A.N. Saxena, K Ramkumar, S.K. Ghosh, "Stresses in TEOS Based SiO2 Films and Reliability of Multilevel Metalizations", Proceedings Ninth International VLSI Multilevel Interconnection Conference (VMIC, Jun. 1992, pp. 427–429.

V. Jamin, D. Praminik, "Impact of Inter Metal Oxide Structures and Nitride Passivaiton on Hot Carrier REliability of Sub–Micron MOS Devices", proceedings Ninth International VLSI Multilevel Interconnection Conference (VMIC), Jun. 1992, pp. 417–419.

N. Shimoyama, K. Machida, K. Murase, T. Tsuchiya, "Enhanced Hot–Carrier Degradation Due to Water in TEOS/O3–Oxide and Water Blocking Effect of ECR–SiO2", IEEE Symposium on VLSI Technology, Jun. 1992, pp. 94–95.

A. Hamada, T. Furusawa, E. Takeda, "A New Aspect on Mechanical Strress Effects in Scaled MOS Devices", IEEE Symposium on VLSI Technology Digest of Technical Papers, Jun. 1990 p. 113.

M. Noyori, T. Ishihara, H. Higuchi "Secondary Slow Trapping—A New Moisture Induced Instability Phenomenon in Scaled CMOS Devices", IEEE 20th Annual Proceedings Reliability 1982, p. 113.

J. Mitsuhashi, H. Muto, Y. Ohno, T. Matsukawa, "Effect of P–SiN Passivation Layer on Time–Dependent Dielectric Breakdown in SiO2", IEEE 25th Annual Proceedings Reliability Physics, Apr. 1987, pp. 60–65.

K.P. MacWilliams, L.E. Lowry, D.J. Swanson, J. Scarpulla, "Water–Mapping of Hot Carrier Lifetime Due to Physical Stress Effects", IEEE Symposium on VLSI Technology, Digest of Technical Papers, Jun. 1992, pp. 100–101.

J. Mitsuhashi, S. Kakao, T. Matsukawa, Mechanical Stress and Hydrogen Effects on Hot Carrier Injection, IEE–IEDM Tech Digest, International Electron Devices Meeting Dec. 1986, p. 386.

Y. Ohno, A. Ohsaki, T. Kaneoka, J. Mitsuhashi, M. Hirayama, T. Kato, "Effect of Mechanial Stress for Thin SiO2 Films in TDDB and CCST Characteristics", IEE 27th Annual Proceedings Reliability Physics, Apr. 1989, pp. 34–38.

W. Abadeer, W. Tonti, et al, "Bias Temperature Reliability of N+ and P+ Polysilicon Gates NMOSFETs and POMSFETs,"IEEE 31st Annual Proceedings Reliability, Aug. 1993, pp. 147–149.

K.O. Jeppson, C.M. Svensson "Negative bias stress of MOS devices at high electric fields and degradation of MNOS devices" Journal of Applied Physics V48, #5, May 1977 pp. 2004–2014.

R.T. Fuller, W.R. Richards, Y. Nissan–Cohen, J.C. Tsang P.M. Sandow, "The Effects of Nitride Layers On Surface Density and the Hot Electron Lifetime of Advanced CMOS Circuits" IEEE 1987, Custom Intefrated Circuits Conference, pp. 337–340.

S. Fujita, Y. Uemoto, A. Sasaki, "Trap Generation in Gate Oxide Layer of MOS Structures Encapsulated by Silicon Nitride", IEDM–IEEE 1985, pp. 64–67.

Stanley Wolf, "Silicon Processing for the VLSI Era", vol. 2 pp.132–133, 144–145, 164–165, 188–189, 194–195, 392–396.

*Primary Examiner*—Stephen D. Meier
*Attorney, Agent, or Firm*—Blakely, Sokoloff, Taylor & Zafman LLP

[57] ABSTRACT

An insulating layer in a semiconductor device and a process for forming the insulating layer is described. The insulating layer comprises of a nitride layer over the substrate having a residual stress of between $-8 \times 10^9$ dynes/cm$^{-2}$ and $-3 \times 10^{10}$ dynes/cm$^{-2}$. The insulating layer can further comprise a doped oxide layer under the nitride layer and can further comprise an interlevel dielectric layer over the nitride layer. Moreover, the nitride layer can be formed by bringing the temperature in a chemical vapor deposition reactor to below 550 degrees Celsius, placing the substrate into the reactor at the temperature, and forming the nitride layer on the substrate. Alternatively, the nitride layer can be formed by pushing the substrate into a chemical vapor deposition reactor at a speed greater than 300 millimeters per minute, and forming the nitride layer on the substrate.

12 Claims, 6 Drawing Sheets

HIGH TENSILE NITRIDE LAYER

This is a divisional of application Ser. No. 08/660,734, filed Jun. 6, 1996 now U.S. Pat No. 5,633,202, which is a continuation of application Ser. No. 08/269,436, filed Jun. 30, 1994 abandoned.

BACKGROUND OF THE INVENTION

1. Field of the Invention

The present invention relates to the field of semiconductor processing and in particular, to the formation of an insulating layer for semiconductor devices.

2. Related Art

One prior processing technique for forming the nitride layer for a semiconductor device involves the use of plasma enhanced chemical vapor deposition. Here, a glow discharge is generated by the application of an rf field to a low pressure gas, thereby creating free electrons within the discharge region. The electrons gain sufficient energy from the electric field so that when they collide with gas molecules, gas-phase dislocation and ionization of the reactant gases (ammonia and silane or dischlorosilane) then occurs. The energetic species are then adsorbed on the surface.

However, semiconductor devices, such as field effect transistors, with nitride layers formed in this manner often exhibit bias-temperature instability. When the semiconductor devices are subjected to bias-temperature stress, the threshold voltage ($V_t$) of the device shifts. In addition, the saturation current ($Id_{sat}$) of the device also degrades under bias-temperature stress.

In addition, semiconductor devices with nitride layers formed in this manner could have relatively high diffusion contact resistance in the source and drain regions.

Moreover, semiconductor devices with nitride layers formed in this manner often experienced dopant segregation in the doped substrate regions. Dopant segregation occurs because subsequent exposure to high temperatures after doping causes the dopants to diffuse from the original doped substrate regions.

Thus, what is needed is a nitride layer and a process for forming a nitride layer for a semiconductor device that results in improved bias-temperature stability and improved diffusion contact resistance.

What is also needed is a nitride layer and process for forming a nitride which experiences reduced dopant segregation.

SUMMARY OF THE INVENTION

A novel insulating layer in a semiconductor device and process for forming the insulating layer is described. The insulating layer comprises of a nitride layer over the substrate having a residual stress of between $-8 \times 10^9$ dynes/cm$^{-2}$ and $-3 \times 10^{10}$ dynes/cm$^{-2}$. The insulating layer can further comprise an interlevel dielectric layer over the nitride layer and can further comprise a doped oxide layer under the nitride layer. The insulating layer can also comprise a refractory metal oxysilicide layer having a thickness less than 100 angstroms. Moreover, the nitride layer can be formed by bringing the temperature in a chemical vapor deposition reactor to below 550 degrees Celsius, placing the substrate into the reactor at the temperature, and forming the nitride layer on the substrate. Alternatively, the nitride layer can be formed by pushing the substrate into a chemical vapor deposition reactor at a speed greater than 300 millimeters per minute, and forming the nitride layer on the substrate. Furthermore, the nitride layer can be formed by removing oxygen around the substrate and forming the nitride layer after removing the oxygen.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

A novel insulating layer and process for forming the insulating layer is described. In the following description, numerous specific details are set forth, such as specific conductivity types, doping levels, and process steps etc. in order to provide a thorough understanding of the present invention. It will, however, be obvious to one skilled in the art that the present invention may be practiced without these details. In other instances, well-known semiconductor processing steps such as cleaning steps, contact steps, metallization and lithography etc. have not been described in particular detail in order not to obscure the present invention.

The following description describes the formation of an exemplary PMOS field effect transistor in a n-well or n-type substrate. It will be obvious to one skilled in the art that the present invention may be used where a NMOS field effect transistor is fabricated using the present invention in a p-type well or substrate region. The dopant conductivity would be simply opposite to that disclosed in the specification. The following description also describes the formation of an exemplary transistor where the source and drain are formed in the substrate. It will be obvious to one skilled in the art that the present invention may be used where the source or drain or both are formed in an epitaxial layer. From here on forward, substrate is meant to include the substrate and any epitaxial layers if any. In addition, the following description describes the formation of a single transistor. It will be obvious to one skilled in the art that the present invention may be used where multiple transistors are fabricated simultaneously.

In addition, the following description describes in detail the formation of a specific exemplary PMOS field effect transistor. It will be appreciated that the present invention may be used in other PMOS field effect transistors or in NMOS field effect transistors. These transistors may or may not have spacers, may or may not use metal gates instead of polysilicon gates, may or may not have silicide layers, may or may not have tip regions in the source or drain, and may or may not have shallow, deep or locos isolation trenches. The present invention can also be used in other semiconductor devices including but not limited to bipolar transistors and capacitors.

Figure 1A:
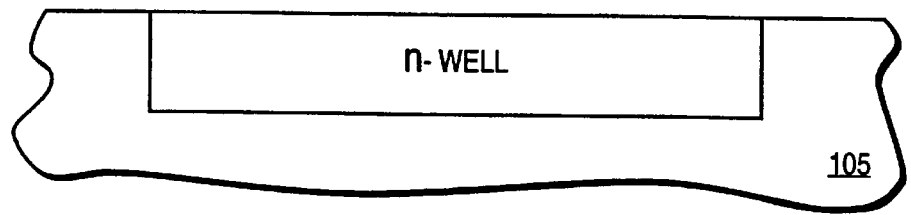
FIG. 1a is an illustration of a cross sectional view showing a portion of a lightly doped p-type substrate with a n-well.

FIG. 1a illustrates the starting material used in one embodiment of the present invention to form a PMOS field effect transistor. The starting material consists of a lightly doped silicon substrate 105 with a p-conductivity type and a dopant concentration of $1.0 \times 10^{14} - 1.0 \times 10^{16}$ cm$^{-3}$. In this embodiment, p-type substrate 105 has a <100>crystalline orientation. An n-well is formed in substrate 105 by implanting or diffusing a n-type dopant such as arsenic or phosphorus using well known techniques.

Figure 1B:
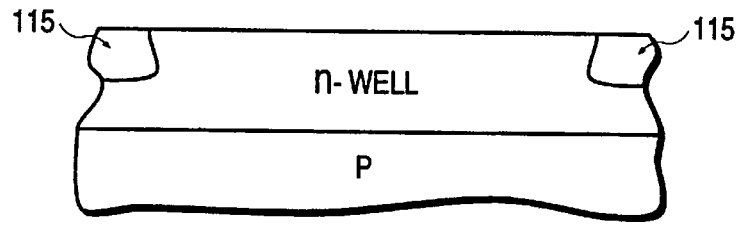
FIG. 1b illustrates the substrate of FIG. 1a after a trench is formed in the substrate.
Figure 1C:
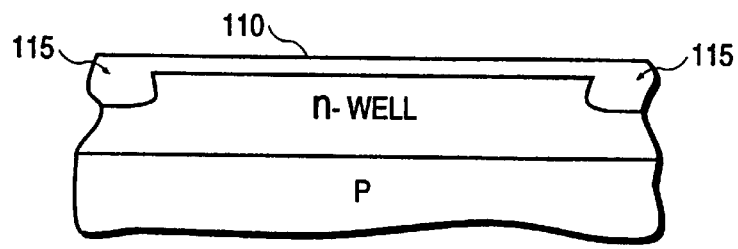
FIG. 1c illustrates the substrate of FIG. 1b after an oxide layer is formed.

Next, trench 115 of the field effect transistor is formed as illustrated in FIG. 1b. Trench 115 can be a shallow trench, deep trench or locos trench and is formed using well known techniques. SiO$_2$ oxide layer 110 is then grown on the surface of substrate 105 as illustrated in FIG. 1c. Oxide layer 110 is formed by exposing substrate 105 to oxygen at high temperatures and is grown to an approximate thickness of between 35 to 250 angstroms. In this embodiment, oxide layer 110 is formed by a chlorinated oxidation process using oxygen (O$_2$) and chlorine (Cl$_2$) or an organic chlorine source or steam and O$_2$ at a temperature of 800 to 1100 degrees Celsius for 0.2 to 4 hours. Oxide layer 110 can also be formed by deposition using well known techniques. Oxide layer 110 is then masked and etched using well known techniques.

Figure 1D:
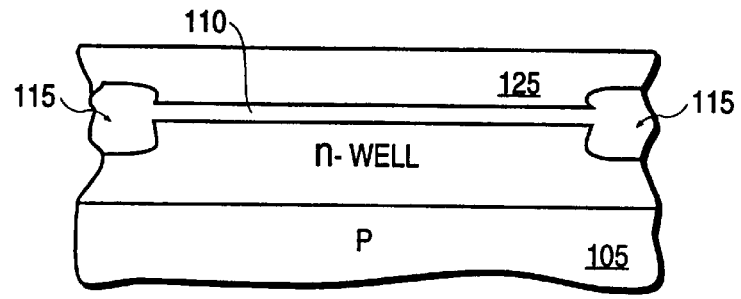
FIG. 1d illustrates the substrate of FIG. 1c after a polysilicon layer is deposited.

Next, as shown in FIG. 1d, polysilicon layer 125 is formed. In this embodiment, substrate is placed in a chemical vapor deposition (CVD) reactor and exposed to silane or chlorosilane at a temperature of 525 to 670 degrees Celsius. Polysilicon layer 125 is formed with a thickness of between 2000 to 5000 angstroms over the entire surface of substrate 105.

Figure 1E:
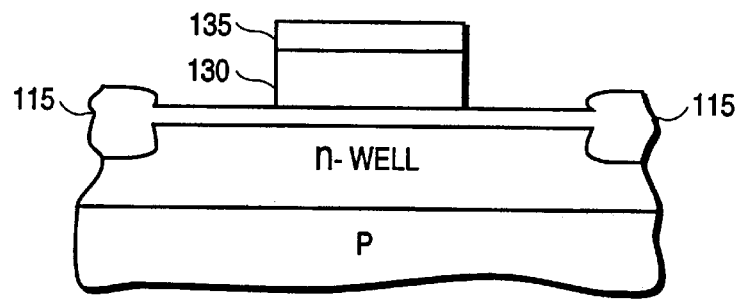
FIG. 1e illustrates the substrate of FIG. 1d after a polysilicon gate is formed.

Next, polysilicon gate 130 is formed as illustrated in FIG. 1e. In this step, photoresist is applied over polysilicon layer 125 and patterned with well known techniques to form photoresist mask 135. Photoresist mask 135 covers the area where polysilicon gate 130 will be formed. Polysilicon gate 130 is formed when the part of polysilicon layer 125 not covered by patterned photoresist is etched away using a plasma etch process. A wet chemical etch process such as hydrogen fluoride nitric acetic can also be used. Photoresist mask 135 is then removed using well known techniques.

Figure 1F:
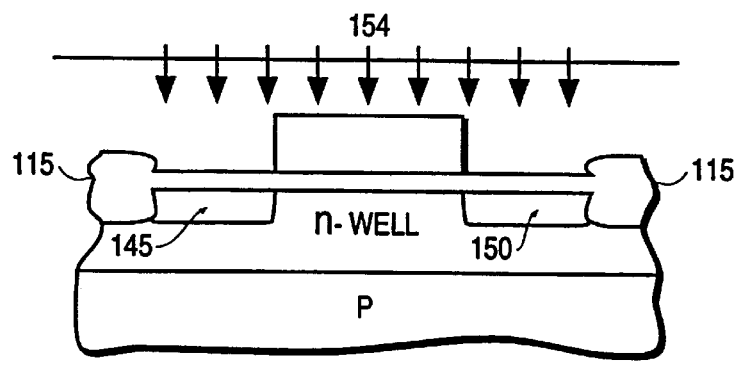
FIG. 1f illustrates the substrate of 1e during ion implantation to form the source tip region and the drain tip region.

Next, tip region 145 of the source and tip region 150 of the drain is formed as illustrated in FIG. 1f. In this step, p-type dopants 154 such as boron (B), boron flouride (BF), boron diflouride (BF$_2$) or indium are implanted into substrate 105. P-type dopants 154 are also implanted into polysilicon gate 130. The implant energy level is 5 to 40 keV with a dose of between $1.0 \times 10^{13}$ to $5.0 \times 10^{15}$ cm$^{-2}$. The implant angle is 0 to 75 degrees. Tip region 145 and tip region 150 with depths of 200 angstroms to 3 microns results with a dopant concentration near the surface of $1 \times 10^{18}$ to $1 \times 10^{21}$ cm$^{-3}$. For a NMOS field effect transistor, n-type dopants such as arsenic or phosphorus are implanted into substrate 105 using photoresist mask 140. The implant energy level is 5 to 60 keV with a dose of between $1.0 \times 10^{13}$ to $5.0 \times 10^{15}$ cm$^{-2}$. A n-type tip region 145 and n-type tip region 150 results. Alternatively, tip region 145 and tip region 150 can also be formed by diffusion using a rapid solid source process. Under this process, substrate 105 is exposed to the dopants for 10 to 90 seconds at 900 to 1100 degrees Celsius. The source and drain regions can also be formed without tip regions 145 and 150.

Figure 1G:
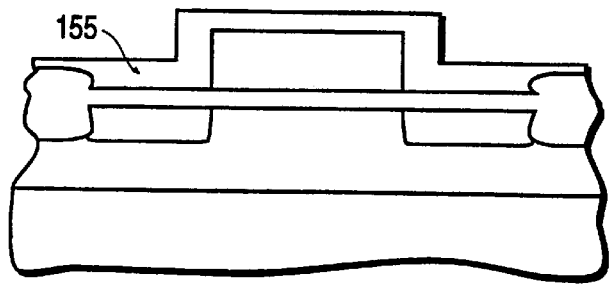
FIG. 1g illustrates the substrate of FIG. 1f after the formation of a conformal layer over the substrate.

Next, as shown in FIG. 1g, a conformal nitride layer or a conformal oxide layer is formed. In this step, substrate 105 is placed in a CVD reactor and exposed to ammonia and silane or dichlorosilane at a temperature of 700 to 900 degrees Celsius. Conformal nitride layer 155 results with a thickness of 500 to 2500 angstroms. Alternatively, a conformal oxide layer can be formed in place of the conformal nitride layer. In this step, substrate 105 is placed in a CVD reactor and exposed to oxygen at 350 to 800 degrees Celsius at low pressure or atmospheric pressure. Conformal oxide layer 155 results with a thickness of 500 to 2500 angstroms.

Figure 1H:
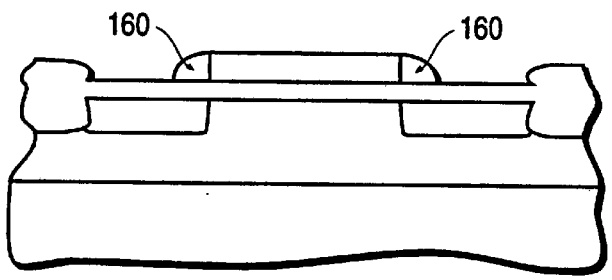
FIG. 1h illustrates the substrate of FIG. 1g after the formation of spacers.

Next, spacers 160 are formed as illustrated in FIG. 1h. In this step, conformal nitride or oxide layer 155 is subjected to an isotropic etch such as a plasma etch. Alternatively, layer 155 can also be subjected to an anisotropic etch. Layer 155 is removed over all regions except for the regions near the edge of polysilicon gate 130 to form spacer 160. Spacers 160 block the further implantation of dopants occurring in later steps into tip region 145 and tip region 150.

Figure 1I:
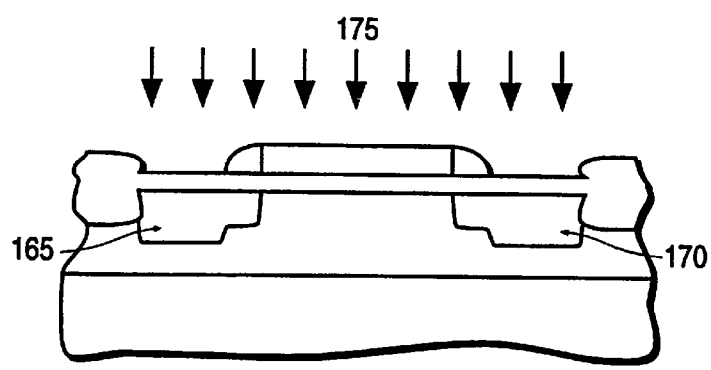
FIG. 1i illustrates the substrate of FIG. 1h during ion implantation to form the source and drain regions.

Next, as shown in FIG. 1i, source region 165 and drain region 170 for the field effect transistor is formed. In this step, p-type dopants 175 are implanted through oxide layer 110 into substrate 105. The region under shallow trench 115 does not receive implant dopants 175 because the thickness of shallow trench 115 blocks dopants 175. Similarly tip regions 145 and 150 also do not receive dopants 175 because oxide spacers 160 block dopants 175. Moreover, the region under polysilicon gate 130 also do not receive dopants 175 because polysilicon gate 130 absorbs dopants 175. Dopants 175 enter polysilicon gate 130 to increase the dopant concentration in polysilicon gate 130 and also enter the regions of substrate 105 only covered by oxide layer 110. Source region 165 and drain region 170 are formed in this manner. Implantation of dopants 175 through oxide layer 110 is accomplished using implant energies of 10–150 keV and dosages of $5.0 \times 10^{14}$ to $2.0 \times 10^{16}$ cm$^{-2}$ at an implant angle of 0 to 15 degrees. The dopants used may be the same species as the dopants used to form tip regions 145 and 150 or the dopants may be a different species. However, the implant ions must be of the same conductivity type as used to form tip regions 145 and 150.

After implantation, a diffusion activation step is performed on substrate 105. Substrate 105 is exposed to temperatures of 800 to 1100 degrees Celsius for 5 seconds to 2 hours. After diffusion activation, source region 165 and drain region 170 have a depth of 0.1 microns to 1 micron.

Source region 165 and drain region 170 can also be formed by diffusion methods using a gas or vapor source.

They can also be formed by a predeposition process followed by a drive-in step.

For a NMOS field effect transistor, arsenic or phosphorus is used as the dopant with an ion energy of 10 to 150 keV with a dosage of $5.0 \times 10^{14}$ to $2.0 \times 10^{16}$ cm$^{-2}$ at an implant angle of 0 to 15 degrees.

Figure 1J:
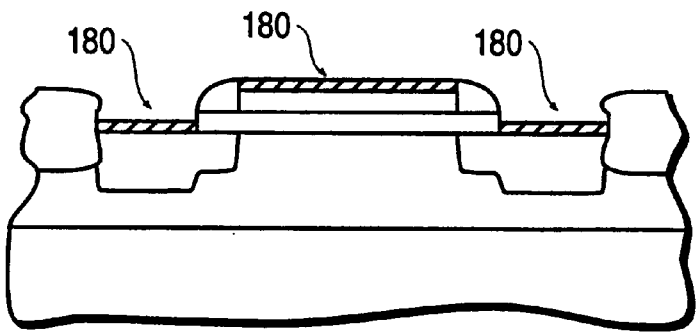
FIG. 1j illustrates the substrate of FIG. 1i after the formation of a silicide layer.

Next, silicide layer 180 is formed as illustrated in FIG. 1j. In this step, a refractory metal such as titanium, tungsten, cobalt or platinum is deposited over the surface substrate 105 using sputter deposition techniques. In this embodiment, titanium is used. Substrate 105 with the refractory metal is exposed to a rapid thermal step at 650 to 850 degrees Celsius for 10 seconds to 10 minutes. The rapid thermal step is performed in nitrogen for titanium. For other refractory metals, other appropriate ambients would be used. A solid phase reaction results between the refractory metal and any silicon it comes in contact with to form silicide layer 180. Refractory metal over oxide and nitride layers do not react to form silicide layers. The unreacted refractory metal over oxide and nitride layers are removed using titanium etch or other appropriate etch. Silicide layer 180 has a thickness of 500 to 1500 angstroms.

Silicide layer 180 is used as an interconnect between semiconductor devices. It is also used to decrease the bulk resistance of gate 130.

Figure 1K:
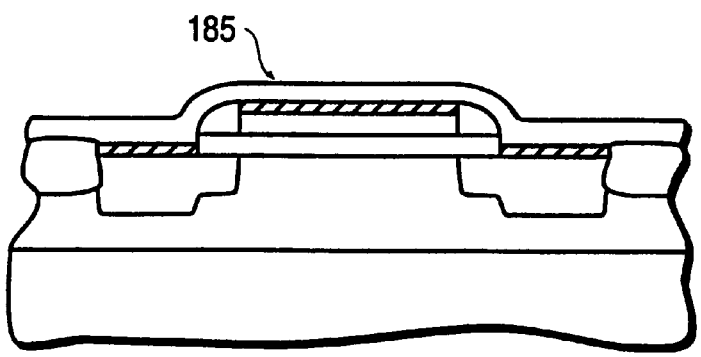
FIG. 1k illustrates the substrate of FIG. 1j after the formation of a nitride layer.

Finally, silicon nitride layer 185 is formed as shown in FIG. 1k. Under one embodiment of the present invention, a hot walled low pressure chemical vapor deposition (LPCVD) reactor with a vertical or horizontal configuration is used. The temperature in the reactor is brought to 550 degrees Celsius or lower. Substrate 105 is then pushed into the LPCVD reactor by an elevator at a rate greater than 300 mm/min for a distance of approximately 1 meter. The LPCVD reactor containing substrate 105 is then evacuated by activating a small pump connected to the small orifice on the reactor. The small pump lowers the pressure in the reactor to less than 50 Torr. The reactor is then idled at the pressure for a minimum of 30 minutes. The idle step allows moisture to be desorbed from the reactor and thus avoids inaccuracies in the main pump leak check.

After the idle step, the temperature in the reactor is raised to 700 to 850 degrees Celsius at a rate of 10±0.5° C./min. The reactor is kept at this temperature for 30 minutes at base pressure. Next, a nitrogen compound such as ammonia (NH$_3$) gas is entered into the reactor. The pressure in the reactor is allowed to rise to 20±1 pascal. After a minimum of 3 minutes (in this embodiment 5.5 minutes), a chlorinated silane such as dichlorosilane (SiCl$_2$H$_2$ or DCS) is also entered into the reactor. Upon the entry of the chlorinated silane gas, nitride layer 185 on substrate 105 begins to form. The chemical reaction is described as NH$_3$+ SiCl$_2$H$_2$→Si$_3$N$_4$+HCl. While the nitrogen compound and chlorinated silane gas continues to flow into the reactor, nitride layer 185 grows at a rate of 10 to 50 Å/min. When nitride layer 185 has reached the desired thickness of 50 to 4000 angstroms (in this embodiment, 500 to 1000 angstroms), the chlorinated silane gas is shut off. The nitrogen compound gas continues to flow into the reactor for a minimum of 3 minutes (in this embodiment, 5 minutes).

Next, the ammonia gas is turned off and for 5 minutes the reactor is pumped back down to base pressure to pump out remaining reactants. Nitrogen gas (N$_2$) is entered into the reactor for 5 minutes while the gate valve remains open to purge the reactor of any reactants. The gate valve is then closed and the pressure in the reactor is allowed to rise to atmospheric pressure. At the same time, the temperature in the reactor is lowered to 700 degrees Celsius or lower at a minimum rate of 1.5° C./min (in this embodiment, 1.5°–4° C./min). The nitrogen gas remains flowing into the reactor. Finally, substrate 105 is pulled out of the reactor.

In the step described above, lowering of the push temperature to 550 degrees Celsius or lower reduces the formation of refractory metal oxysilicide before passivation of the silicide layer by the nitride layer and thus reduces the thickness of the refractory metal oxysilicide layer. Formation of refractory metal oxysilicide is reduced because the lower temperature results in a lower reaction rate between silicide and oxygen. In addition, using the relatively fast push speed of 300 mm/min or greater also reduces the formation of refractory metal oxysilicide because the exposure time of substrate 105 in oxidizing ambient at high temperatures is reduced. Moreover, evacuating the reactor to a pressure below 50 Torr before raising the temperature also reduces the formation of refractory metal oxysilicide because the reduction of pressure significantly reduces the presence of oxygen in the reactor. Thus, when the temperature of the reactor is raised to 700 to 850 degrees Celsius, the normally high oxidation rate of silicide layer 180 is reduced because the presence of oxygen is reduced.

Under a second embodiment of the present invention, a hot walled reactor is used to form nitride layer 185. The temperature in the hot walled vertical reactor is initially brought to less than 525 degrees Celsius. This lower temperature is used because it further reduces the formation of refractory metal oxysilicide. Substrate 105 is then pushed into the LPCVD reactor by an elevator at a rate of 500 mm/min for a distance of approximately 1 meter. This push speed is used because it also further reduces the formation of refractory metal oxysilicide. The LPCVD reactor containing substrate 105 is then evacuated by activating a small pump connected to the small orifice on the reactor. The small pump connected to the small orifice lowers the pressure in the reactor to 10 Torr taking approximately 5 minutes to reach a pressure of 10 Torr. Next, the four inch gate valve on the reactor is opened further evacuating the reactor to base pressure of less than 1 pascal (in this embodiment, 0.5 pascal). The small orifice is opened before the gate valve in this step to avoid swirling of gases inside the reactor. This base pressure is used because it also further reduces the formation of refractory metal oxysilicide. The reactor is then idled at base pressure for 30 minutes. The remaining steps is the same as the first embodiment.

Under a third embodiment, nitride layer 185 is formed using a vacuum load lock chamber with a CVD reactor. Under this embodiment, substrate 105 is placed into a vacuum load lock chamber at room temperature and atmospheric pressure. The chamber is then sealed and the pressure in the chamber is reduced to base pressure of less than 1 pascal. Substrate 105 is then pushed into the CVD reactor from the vacuum chamber. Under the third embodiment, a slow push speed as well as a fast push speed can be utilized in pushing substrate 105 into the CVD reactor because substrate 105 is already at base pressure when entering the CVD reactor. At base pressure, substrate 105 is not exposed to significant amounts of oxygen and little if any oxidation of the silicide layer occurs. Thus, a fast push speed is not required. When substrate 105 enters the CVD reactor, the reactor is already at the nitride processing temperature of 550 to 840 degrees Celsius and is filled with a nitrogen compound such as ammonia at 20±1 pascal. A chlorinated silane is then entered into the reactor and nitride layer 185 is formed as described above under the first embodiment.

Under a fourth embodiment, nitride layer 185 is formed using an extended tube. Here, substrate 105 is placed into an extended tube filled with a nonoxidizing ambient such as nitrogen ($N_2$) or argon at room temperature. Substrate 105 is then pushed into the CVD reactor from the extended tube. Under the fourth embodiment like the third, a slow push speed as well as a fast push speed can be utilized in pushing substrate 105 into the CVD reactor because substrate 105 is already at base pressure when entering the CVD reactor. At base pressure, substrate 105 is not exposed to significant amounts of oxygen and little if any oxidation of the silicide layer occurs. Thus, a fast push speed is not required. When substrate 105 enters the CVD reactor, the reactor is already at the nitride processing temperature of 550 to 840 degrees Celsius and is filled with a nitrogen compound such as ammonia at 20±1 pascal. A chlorinated silane is then entered into the reactor and nitride layer 185 is formed as described above under the first embodiment.

Figure 2:
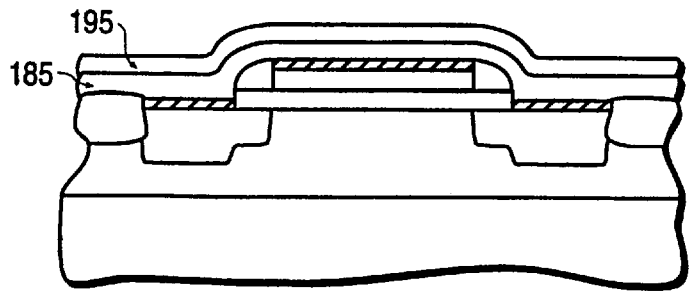
FIG. 2 illustrates the substrate of FIG. 1k after the formation of an interlevel dielectric layer.

Under a fifth embodiment, interlevel dielectric layer 195 is formed over nitride layer 185 as shown in FIG. 2. Substrate 105 is placed into a chemical vapor deposition (CVD) reactor. Reactant gases are flowed into the reactor at atmospheric pressure and 350 to 450 degrees Celsius. Alternatively, the reactant gases can also be flowed into the reactor at 200 to 700 millitorr and 550 to 750 degrees Celsius. Interlevel dielectric layer 195 can be boron phosphorus doped silicate glass (BPSG) or phosphorus doped silicate glass (PSG).

To form PSG, silicon source and a phosphorus source are used as reactant gases. The silicon source can be a silane such as a chlorosilane or tetraethylorthosilcate (TEOS) and the phosphorus source can be a gas such as diphosphide or trimethylphosphide (TMP). To form BPSG, a boron source is also used as a reactant gas. The boron source can be a gas such as diborane or trimethylborate (TMB).

After interlevel dielectric layer 195 is formed, a planarization process is performed on substrate 105. Here, substrate 105 is subjected to a rapid thermal step in a rapid thermal furnace. Substrate 105 is exposed to nitrogen, oxygen or nitrogen and oxygen at 750 to 1100 degrees Celsius for 30 seconds to 5 minutes. Under this embodiment, the temperature range is 750 to 950 degrees Celsius. Interlevel dielectric layer 195 has a thickness of 0.5 to 1.2 microns.

The rapid thermal process is used because it reduces the exposure of substrate 105 to high temperatures. The exposure reduction in turn reduces subsequent diffusion of dopants from doped regions. Thus, a semiconductor device undergoing the rapid thermal process is better able to maintain the existing dopant profile in the doped regions.

Use of interlevel dielectric layer 195 allows a thinner nitride layer 185 to be used. The thinner nitride layer 185 combined with interlevel dielectric layer 195 provides sufficient vertical isolation to the field effect transistor to allow it to operate properly. Without interlevel dielectric layer 195, a thinner nitride layer 185 would not provide sufficient vertical isolation to the field effect transistor to allow it to operate properly. Interlevel dielectric layer 195 has a dielectric constant of 3.8 which is less than a dielectric constant of 7.4 for nitride layer 185. Thus, when interlevel dielectric layer 195 is used and the thickness of nitride layer 185 reduced, the net effect of the combination is to reduce the total dielectric constant. The lower dielectric constant in turn reduces the coupling capacitance between the metal contact and gate.

The use of a thinner nitride layer 185 also enhances the manufacturability of nitride layer 185. Nitride layer 185 in this embodiment, has high residual stresses. The residual stresses causes the formation of microcracks in nitride layer 185, the quantity of which increase as the thickness of nitride layer 185 increases. The microcracks in turn decrease the structural stability of nitride layer 185. Thus, when interlevel dielectric layer 195 is used, a thinner nitride layer 185 can also be used thereby enhancing the manufacturability of nitride layer 185.

Figure 3:
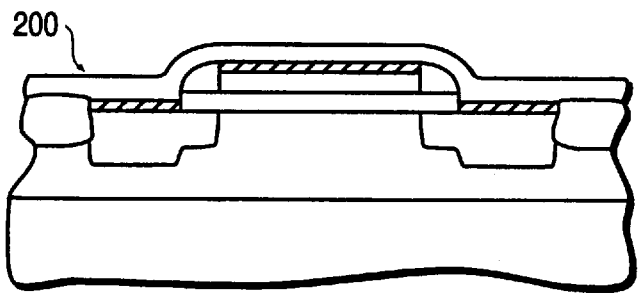
FIG. 3 illustrates the substrate of FIG. 1j after the formation of a doped oxide layer.

Under a sixth embodiment, oxide layer 200 is formed over silicide layer 180 as shown in FIG. 3. Oxide layer 200 is formed after silicide layer 180 formation as described under FIG. 1j but before nitride layer 185 formation as described under FIG. 1k. Oxide layer 200 is formed by placing substrate 105 into a continuous process CVD reactor at 350 to 430 degrees Celsius. Oxygen and a silicon source such as a silane, chlorosilane or TEOS is flowed into the reactor. Oxide layer 200 is grown to a thickness of 100 to 1000 angstroms. To form a boron doped oxide layer, a boron source such as diborane or TMB is flowed in with the oxygen and the silicon source resulting in a doped oxide layer with a boron concentration of 0.5 to 4 percent by weight. To form a boron phosphorus doped oxide layer, a boron source and a phosphorus source such as phosphine or TMP is flowed in with the oxygen and silicon source resulting in a doped oxide layer with a boron concentration of 0.5 to 4 percent and a phosphorus concentration of 0 to 7 percent by weight. Nitride layer 185 is then formed as described under FIG. 1k. Interlevel dielectric layer 195 is formed as described under FIG. 2.

Alternatively, oxide layer 200 can be formed by placing substrate 105 into a LPCVD reactor at 600 to 750 degrees Celsius. Oxygen and a silicon source is flowed in to form an undoped oxide layer. The deposition time is 10 to 20 minutes. A boron source is flowed in to form a boron doped oxide layer. A boron source and phosphorus source is flowed in to form a boron phosphorus doped oxide layer. A nitride layer is then formed as described under FIG. 1k and an interlevel dielectric layer is then formed as described under FIG. 2.

The use of a doped oxide layer before nitride layer 185 creates a high concentration region of dopants outside the source and drain regions. When subsequent exposure to high temperatures occurs, diffusion of source and drain dopants from the source and drain is offset by diffusion of oxide dopants into the source and drain. This offset allows the dopant concentration profile of the source and drain regions to change more gradually under exposure to high temperatures. In this manner, the effects of dopant segregation is reduced.

Figure 4:
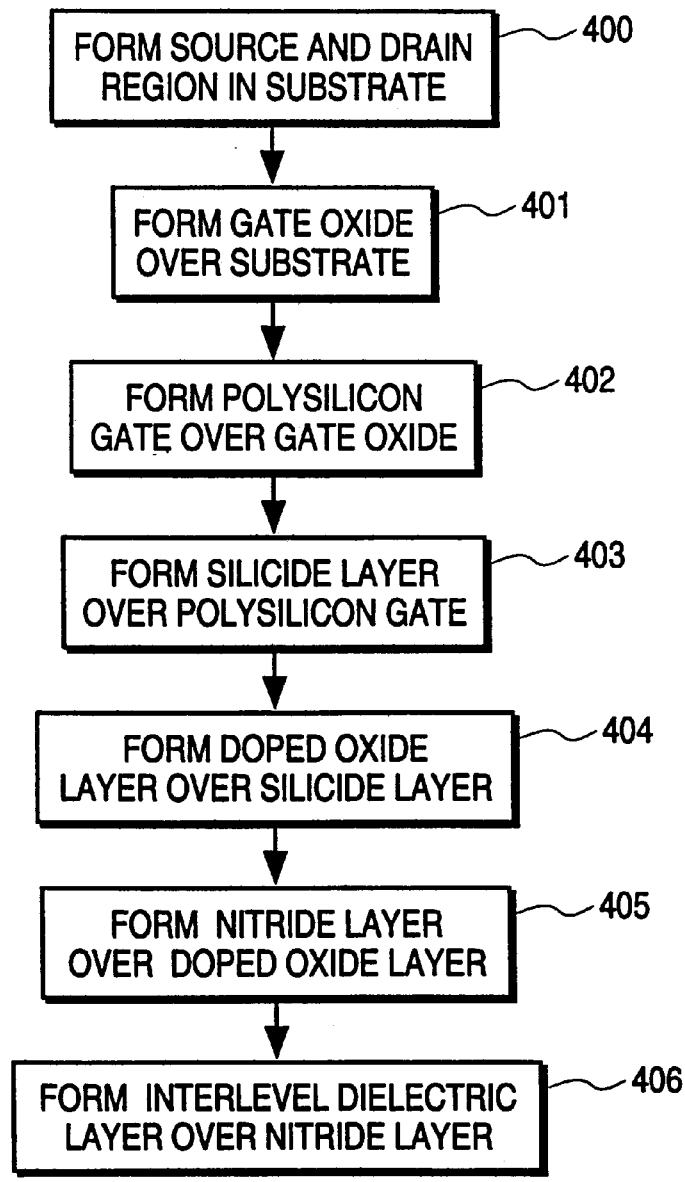
FIG. 4 illustrates the process steps in forming a semiconductor device of one embodiment of the present invention.

The process steps for forming a field effect transistor under the sixth embodiment of the present invention is illustrated in FIG. 4. First, a source and drain region is formed in the substrate as shown in block 400. Next, a gate oxide region is formed over the substrate as shown in block 401. Then, a polysilicon gate is formed over the gate oxide as shown in block 402. A silicide layer is formed over the polysilicon gate as shown in block 403. Next, a doped oxide layer is formed over the silicide layer as shown in block 404. A nitride layer is then formed over the doped oxide layer as shown in block 405. Afterwards, an interlevel dielectric layer is formed over the nitride layer.

Using the steps described in the first, second, third or fourth embodiment, a field effect transistor can be formed. The field effect transistor comprises of a nitride layer with a thickness of 50 to 4000 angstroms (or alternatively 500 to 1000 angstroms) and residual stress of $-8 \times 10^9$ dynes/cm$^{-2}$ to $-3 \times 10^{10}$ dynes/cm$^{-2}$. The transistor also comprises of a source region and a drain region. Moreover, the transistor comprises of a gate. The gate can comprise of a metal or of a polysilicon layer with a dopant concentration of $1.0\times10^{19}$ to $5.0\times10^{21}$ cm$^{-3}$ of p-type dopants at the surface for a PMOS device. Alternatively, the gate can comprise of a polysilicon layer with a dopant concentration of $1.0\times10^{19}$ to $5.0\times10^{21}$ cm$^{-3}$ of n type dopants at the surface for a NMOS device.

In most semiconductor devices, bias-temperature stress causes saturation current (Id$_{sat}$) degradation and shifting of the threshold voltage (V$_t$). As an example, in PMOS devices, a negative voltage bias applied to the gate can impart sufficient energy to electrons in the gate to cause them to tunnel through the gate oxide. Once they reach the gate oxide—silicon interface, they can still have sufficient energy to create holes through Auger recombination. These holes are trapped at the interface and create positive charge at the interface. The positive charge reduces carrier mobility in the p channel of the substrate thus degrading saturation current and increasing the threshold voltages.

A residual tensile stress in the nitride layer results in a compressive stress being applied to the layers below the nitride layer. The compressive stress improves the interfacial characteristics at the gate oxide-silicon interface. This improvement reduces the quantity of trapped holes created by Auger recombination at the gate oxide-silicon interface. The reduction in trapped holes reduces saturation current (Id$_{sat}$) degradation and reduces shifting of threshold voltage (V$_t$).

Figure 5:
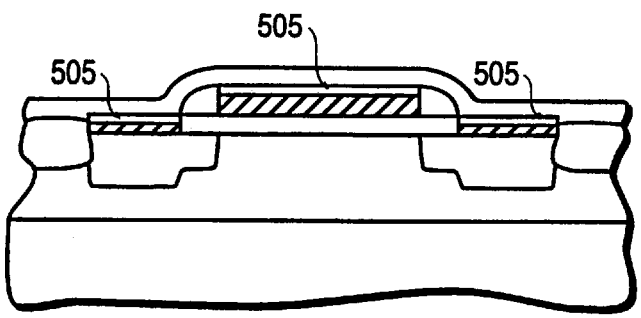
FIG. 5 illustrates a refractory metal oxysilicide layer in a semiconductor device of one embodiment of the present invention.

Under a seventh embodiment, the transistor can further comprise of a silicide layer with a thickness of 500 to 1500 angstroms and can also further comprise of a refractory metal oxysilicide layer 505 with a thickness of less than 100 angstroms as shown in FIG. 5.

The reduced thickness of the refractory metal oxysilicide layer reduces the resistance of the diffusion contact. The lower resistance decreases the voltage drop. The decreased voltage drop in turn decreases the threshold voltage and increases the saturation current. The lower resistance also improves the switching characteristics of a MOS device because current to and from the gate is increased.

Under an eighth embodiment, the field effect transistor can also comprise of a doped oxide layer between the nitride layer and the refractory metal oxysilicide layer. The doped oxide layer can be boron doped with a boron concentration of 0.5 to 4 percent by weight. The doped oxide layer can also be boron and phosphorus doped with a boron concentration of 0.5 to 4 percent and a phosphorus concentration of zero to seven percent by weight. Doped oxide layer 300 can have a thickness of 100 to 1000 angstroms or under this embodiment, 100 to 200 angstroms.

Under a ninth embodiment, the field effect transistor can also comprise of an interlevel dielectric layer. The interlevel dielectric layer can comprise of BPSG or PSG having a thickness of 0.5 to 1.2 microns.

Under a tenth embodiment, a nitride layer can be formed over a bipolar transistor using the steps described for the first, second, third or fourth embodiment. Here, a collector region is formed in a substrate using implantation or diffusion. A base region is formed in the collector region using implantation or diffusion. An emitter region is formed in the base region using implantation or diffusion. The emitter region can also be formed by applying a polysilicon layer over the substrate and doping the polysilicon layer using diffusion or implantation. A nitride layer is then formed over the bipolar transistor using the LPCVD process of the first or second embodiment. The nitride layer has a residual stress of $-8\times10^9$ dynes/cm$^{-2}$ to $-3\times10^{10}$ dynes/cm$^{-2}$. The nitride layer serves to insulate and passivate the bipolar transistor.

The bipolar transistor formed can be a npn transistor or a pnp transistor. A npn transistor is formed by implantation or diffusion of n type dopants for the collector region, implantation or diffusion of p type dopants for the base region, and implantation or diffusion of n type dopants for the emitter region. A pnp transistor is formed by implantation or diffusion of p type dopants for the collector region, implantation or diffusion of n type dopants for the base region, and implantation or diffusion of p type dopants for the emitter region.

Under an eleventh embodiment, the bipolar transistor can also comprise of doped oxide layer under the nitride layer. In this embodiment, the doped oxide layer is in contact with the nitride layer. However, it does not have to be in direct contact. Doped oxide layer can be boron doped with a boron concentration of 0.5 to 4 percent. Doped oxide layer can also be boron and phosphorus doped with a boron concentration of 0.5 to 4 percent and a phosphorus concentration of zero to seven percent. Doped oxide layer reduces dopant segregation in the bipolar transistor. Under a twelfth embodiment, the bipolar transistor can also include a silicide layer and a thin refractory metal oxysilicide layer of less than 100 angstroms thickness. The silicide layer and the thin refractory metal oxysilicide layer are both under the nitride layer in this embodiment. Under a thirteenth embodiment of the present invention, the bipolar transistor can comprise of an interlevel dielectric layer over the nitride layer. The interlevel dielectric layer can comprise of BPSG or PSG having a thickness of 0.5 to 1.2 microns.

In addition, the nitride layer can also be formed as part of other semiconductor devices including but not limited to capacitors. The nitride layer can be used anywhere an insulating layer or a passivation layer is needed.

In the foregoing description, the invention is described with reference to specific exemplary embodiments thereof. It will, however, be evident that various modifications and changes may be made thereto without departing from the broader spirit and scope of the invention as set forth in the appended claims. The specifications and drawings are, accordingly, to be regarded in an illustrative rather than a restrictive sense.

Thus, a novel insulating layer and process for forming the insulating layer has been described.

What is claimed is:

1. An insulating layer in a semiconductor device comprising:

a doped oxide layer on a doped region of said semiconductor devices;

a nitride film having a residual stress of between $-8\times10^{10}$ dynes/cm$^2$ and $3\times10^{10}$ dynes/cm$^2$ formed on said doped oxide layer; and an interlayer dielectric layer on said nitride film.

2. A semiconductor device comprising:

a silicide layer;

a refractory metal oxysilicide layer having a thickness of less than 100 angstroms over said silicide layer; and a nitride layer on said refractory metal oxysilicide layer; and an interlayer dielectric on said nitride layer.

3. A field effect transistor comprising:

a source region;

a drain region coupled to said source region;

a silicide layer;

a refractory metal oxysilicide layer having a thickness of less than 100 angstroms;

a nitride layer over said refractory metal oxysilicide layer having a residual stress of between $-8 \times 10^9$ dynes/cm$^2$ and $-3 \times 10^{10}$ dynes/cm$^2$; and an interlevel dielectric layer over said nitride layer.

4. An integrated circuit comprising:

a device having a silicide layer;

a doped oxide layer on said silicide layer;

a nitride layer having a tensile stress on said doped oxide layer; and an interlayer dielectric on said nitride layer.

5. An integrated circuit comprising:

a transistor on a semiconductor substrate, said transistor having at least one silicide region;

a doped oxide layer on said transistor including said silicide region;

a nitride layer having a tensile stress on said doped oxide layer; and an interlayer dielectric on said nitride layer.

6. The integrated circuit of claim 5 wherein said doped oxide layer is a phosphorus doped oxide layer.

7. The integrated circuit of claim 5 wherein said doped oxide layer is a boron doped oxide layer.

8. The integrated circuit of claim 5 wherein said nitride layer has a tensile stress between $8 \times 10^9$ dynes/cm$^2$ and $3 \times 10^{10}$ dynes/cm$^2$.

9. An integrated circuit comprising:

a transistor having a source, a gate and a drain;

a refractory silicide on said source and said drain;

a doped oxide layer on said transistor and on said refractory metal silicide and on said source and said drain;

a nitride layer having a residual tensile stress on said doped oxide layer; and an interlayer dielectric on said nitride layer.

10. The integrated circuit of claim 9 wherein said transistor is a PMOS transistor and said doped oxide layer is a boron doped oxide layer.

11. The integrated circuit of claim 9 wherein said transistor is a NMOS transistor and said doped oxide layer is a phosphorus doped oxide layer.

12. The integrated circuit of claim 9 wherein said nitride layer has a tensile stress of between $8 \times 10^9$ dynes/cm$^2$ and $3 \times 10^{10}$ dynes/cm$^2$.

* * * * *